United States Patent [19]
Kakuta et al.

[11] Patent Number: 6,147,557
[45] Date of Patent: Nov. 14, 2000

[54] SEMICONDUCTOR CIRCUIT COMPENSATING FOR CHANGES IN GAIN SLOPE OF THE CIRCUIT'S GAIN-FREQUENCY CHARACTERISTIC CAUSED BY AMBIENT TEMPERATURE CHANGES

[75] Inventors: Yuji Kakuta; Yoshiaki Fukasawa; Yuichi Taguchi, all of Tokyo, Japan

[73] Assignee: NEC Corporation, Tokyo, Japan

[21] Appl. No.: 09/195,621

[22] Filed: Nov. 19, 1998

[30] Foreign Application Priority Data

Nov. 27, 1997 [JP] Japan ................................. 9-326445

[51] Int. Cl.⁷ .............................. H03F 3/16; H03F 3/191
[52] U.S. Cl. .......................... 330/277; 330/289; 330/302; 330/311
[58] Field of Search ................. 330/277, 289, 330/302, 294, 311

[56] References Cited

U.S. PATENT DOCUMENTS 3,566,288  2/1971  Oomen ..................................... 330/289
4,207,538  6/1980  Goel ..................................... 330/289 X

FOREIGN PATENT DOCUMENTS

57-83910    5/1982   Japan .
57-157606   9/1982   Japan .
62-97411    5/1987   Japan .
2-280511   11/1990   Japan .
3-283458   12/1991   Japan .

Primary Examiner—Steven J. Mottola
Attorney, Agent, or Firm—Sughrue, Mion, Zinn, Macpeak & Seas, PLLC

[57] ABSTRACT

Compensating for fluctuations in the gain characteristic of the gain slope in the event of changes in ambient temperature without increasing circuit scale or adding to costs. A thermistor, which is a thermally sensitive resistance element in which resistance changes with a negative temperature characteristic according to the ambient temperature, is employed as the gate resistance of an FET, and the circuit functions such that fluctuations in the gain characteristic of the gain slope with respect to ambient temperature are canceled out by fluctuations in the value of Q with respect to the ambient temperature, thereby compensating for fluctuations in the gain slope characteristic in the event of changes in the ambient temperature.

26 Claims, 5 Drawing Sheets

$$Q = \frac{2\pi fL}{R}$$

FIG. 5

$$Q = \frac{2\pi fL}{Rt}$$

SEMICONDUCTOR CIRCUIT COMPENSATING FOR CHANGES IN GAIN SLOPE OF THE CIRCUIT'S GAIN-FREQUENCY CHARACTERISTIC CAUSED BY AMBIENT TEMPERATURE CHANGES

BACKGROUND OF THE INVENTION

1. Field of the Invention

The present invention relates to a semiconductor circuit, and particularly to a semiconductor circuit used in a CATV [CAble TeleVision] hybrid IC (HIC).

2. Description of the Related Art

To compensate for loss in connection cables in a HIC broadband amplifier for CATV, a gain slope is set by which gain of the amplifier rises with higher frequencies, but this gain slope fluctuates with variations in ambient temperature.

Fluctuations in the gain characteristic due to variations in ambient temperature must therefore be corrected to maintain a uniform signal level over the entire CATV system.

Figure 1:
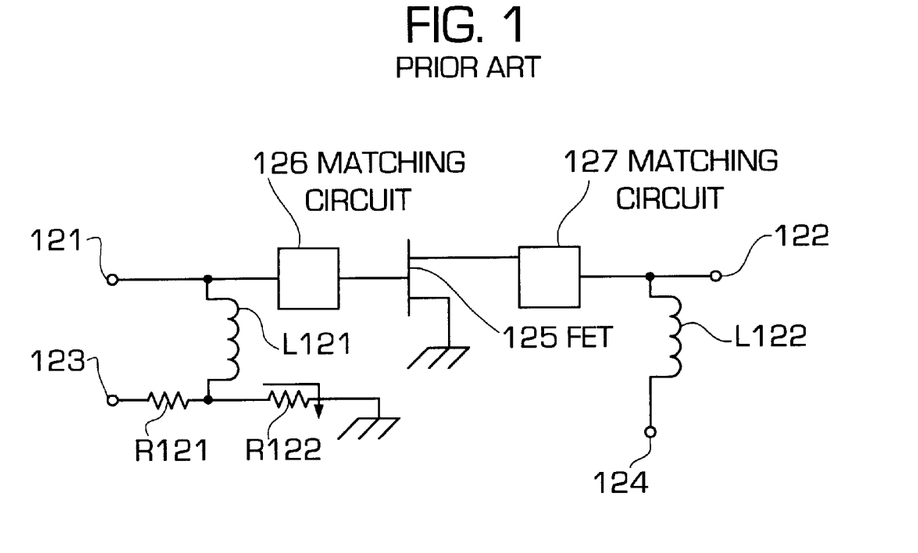
FIG. 1 is a circuit diagram showing the configuration of a circuit used in the prior art disclosed in Japanese Patent Laid-open No. 83910/82 that compensates for fluctuations in gain characteristic due to variations in ambient temperature.

FIG. 1 is a circuit diagram showing the configuration of a circuit disclosed in Japanese Patent Laid-open No. 83910/82 that has been used in the prior art for compensating for fluctuations in gain characteristic caused by variations in ambient temperature.

As shown in FIG. 1, this example of the prior art is made up of: FET(Field Effect Transistor) 125 having its gate terminal connected to input terminal 121 by way of matching circuit 126, its drain terminal connected to output terminal 122 by way of matching circuit 127, and its source terminal grounded; inductor L121 having one terminal connected to input terminal 121; resistor R121 having one terminal connected to the terminal of inductor L121 that is not connected to input terminal 121 and its other terminal connected to gate bias supply terminal 123; thermistor R122 having one terminal connected to the terminal of inductor L121 that is not connected to input terminal 121 and its other terminal grounded; and inductor L122 having one terminal connected to output terminal 122 and its other terminal connected to drain bias supply terminal 124. The gate bias is supplied to the gate terminal of FET 125 from gate bias supply terminal 123 by way of matching circuit 126, inductor L121, and resistor R121, and the drain bias is supplied to the drain terminal of FET 125 from drain bias supply terminal 124 by way of matching circuit 127 and inductor L122.

In this case, the resistance of resistor R121 is set such that the relation of gate bias Vgs1 supplied from gate bias supply terminal 123 with respect to normal gate bias Vgs is:

$$|Vgs|<|Vgs1|$$

When the ambient temperature is higher than room temperature, the resistance of thermistor R122 is smaller than for cases in which the ambient temperature is at room temperature due to its own temperature nonlinearity, and if the gate bias in such cases is Vgs2, then:

$$|Vgs2|<|Vgs1|$$

Accordingly, assuming that the gain during gate bias Vgs1 is GVgs1, that the gain during gate bias Vgs2 is GVgs2, and that the gain is GVgs3 for an amplifier in which gate bias is set to Vgs in an ambient atmosphere that is at a higher temperature than room temperature, this amplifier having a bias circuit that is not provided with thermistor R122, then:

$$GVgs3<GVgs2$$

and fluctuations in gain characteristic due to variations in ambient temperature can be compensated.

Nevertheless, the above-described circuit of the prior art has the following disadvantages:

Changing the FET frequency-gain characteristics by bias conditions means that temperature compensation is multiplied by bias, and bias voltage therefore reaches high levels in the case of high or low temperatures, increasing the current consumption of the FET and thereby increasing the heat stress imposed upon elements at high temperatures.

The operating points are determined based on the DC characteristic of elements, and the high frequency characteristic is therefore dependent on the DC characteristic, and differences in the DC characteristic of elements therefore cause discrepancies in the frequency characteristic.

Figure 2:
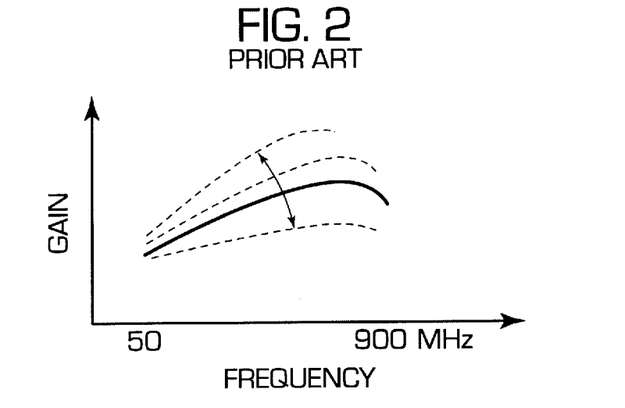
FIG. 2 shows the fluctuations in the gain characteristic of the gain slope according to variations in the ambient temperature.

FIG. 2 shows the fluctuation in the gain characteristic of the gain slope according to variations in ambient temperature.

As shown in FIG. 2, when ambient temperature varies in the case of a broad band such as in a CATV system, not only does the gain curve that represents the gain slope fluctuate parallel to the direction of gain, but the slope of the curve also varies.

Although compensation can be achieved for fluctuation parallel to the direction of gain in the circuit shown in FIG. 1, fluctuation for the slope cannot be compensated.

Because the bias is set by the voltage division ratio of the bleeder resistance, a plurality of elements are necessary for realizing temperature compensation, and this requirement both increases the scale of the circuit and raises costs.

SUMMARY OF THE INVENTION

The object of the present invention is to provide a semiconductor circuit that can compensate for fluctuations in the gain characteristic of the gain slope in the event of variations in ambient temperature without increasing the scale of the circuit or raising costs.

In the present invention, a thermistor, which is a thermally sensitive resistance element having a negative temperature characteristic according to the ambient temperature, is employed as the gate resistance of a FET. Here, the Q value, which is the factor indicating the resonance point level, decreases to the degree that the resistance of the thermistor rises, the Q value thus becoming large as the ambient temperature rises and becoming small as the ambient temperature falls. When ambient temperature rises, the inclination of the gain slope in a semiconductor element becomes gentle, but when the ambient temperature falls, the gain increases and the inclination of the gain slope becomes steep. Fluctuation in the value Q with respect to the ambient temperature is therefore canceled by fluctuation in gain characteristic of the gain slope with respect to the ambient temperature, whereby the inclination characteristic of the gain slope is uniform even in the event of changes in the ambient temperature.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS:

First Embodiment

Figure 3:
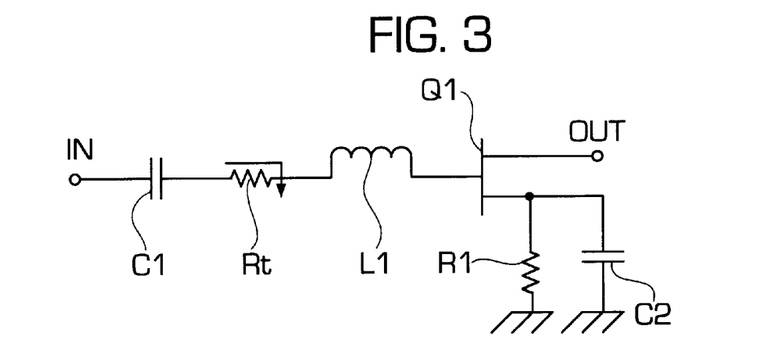
FIG. 3 is a circuit diagram showing the configuration of the semiconductor circuit according to the first embodiment of the present invention.

FIG. 3 is a circuit diagram showing the configuration of a semiconductor circuit according to the first embodiment of the present invention, and principally shows the circuit that compensates for fluctuations in gain characteristic of the gain slope with respect to ambient temperature. This circuit is only the alternating-current portion of the semiconductor circuit of this invention.

As shown in FIG. 3, this embodiment is made up of first FET Q1, the drain side of which is the output terminal; first inductor L1 having one terminal connected to the gate terminal of FET Q1; thermistor Rt which is the first resistance that is a thermally sensitive resistance element having resistance that changes with a negative temperature characteristic according to the ambient temperature and having one terminal connected to the terminal of inductor L1 that is not connected to FET Q1; first capacitor C1 connected between the terminal of thermistor Rt that is not connected to inductor L1 and the input terminal; and third resistance R1 and second capacitor C2 that are connected in parallel between the source terminal of FET Q1 and ground. Resistance R1 and second capacitor C2 are elements that regulate frequency characteristics and are not essential components of the present invention.

Thermistor Rt, which is provided as the input resistance of FET Q1, has a negative temperature characteristic and therefore has low resistance when the ambient temperature is high and high resistance when the ambient temperature is low.

Explanation is next presented regarding the operation of the circuit configured according to the foregoing description.

Figure 4:
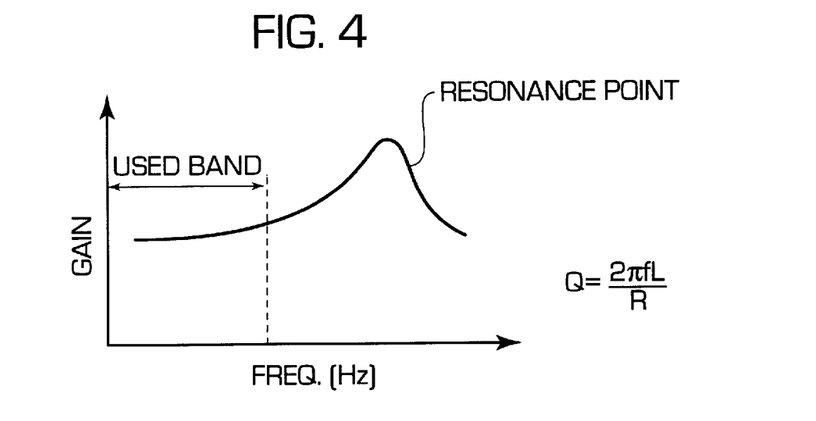
FIG. 4 shows an example of the gain characteristic with respect to frequency in a typical resonant circuit.
Figure 5:
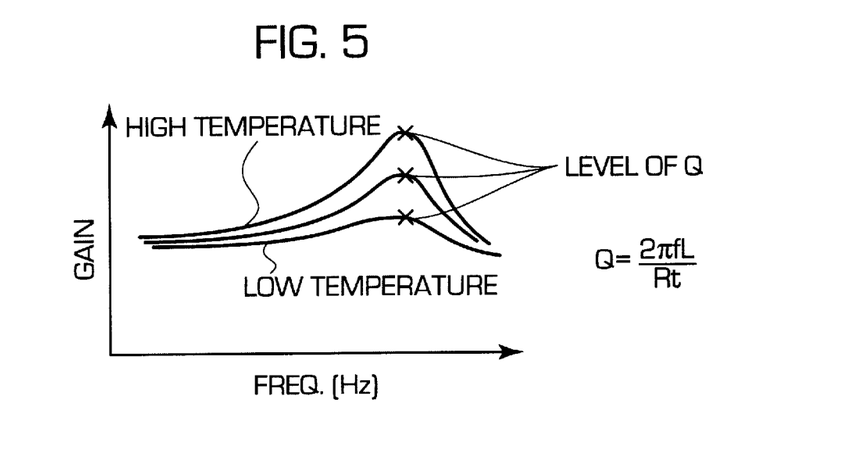
FIG. 5 is an explanatory view of the gain characteristic with respect to frequency in the circuit shown in FIG. 3.

FIG. 4 shows one example of the gain characteristic with respect to frequency in a typical resonant circuit. FIG. 5 is provided to illustrate the gain characteristic with respect to frequency in the circuit shown in FIG. 3.

As shown in FIG. 4, the resonance point in a typical resonant circuit exists outside the band that is employed, and the value of Q, which is a factor indicating this resonance point level, can be represented by:

$$Q = 2\pi fL/R$$

or:

$$Q = 1/(2\pi fCR)$$

As shown in FIG. 3, when using thermistor Rt as resistance R in which the resistance becomes low when the ambient temperature rises and high when the ambient temperature is low, the value of Q decreases to the extent that the resistance of thermistor Rt increases and increases to the extent that the resistance of thermistor Rt decreases as shown in the above equations, and as shown in FIG. 5, the value of Q thus increases when the ambient temperature rises and decreases when the ambient temperature falls.

The circuit shown in FIG. 3 can achieve frequency-gain characteristics due to variations in ambient temperature such as shown in FIG. 5, but in a circuit that realizes a gain slope, increase in the ambient temperature results in a gentle inclination of the gain slope, and decrease in the ambient temperature results in increased gain and a steep inclination of the gain slope.

As a result, fluctuation in the value of Q with respect to ambient temperature is canceled out by fluctuation of the gain characteristic with respect to ambient temperature of the gain slope in the circuit shown in FIG. 3, and inclination of the gain slope is therefore uniform despite variations in the ambient temperature.

Figure 6:
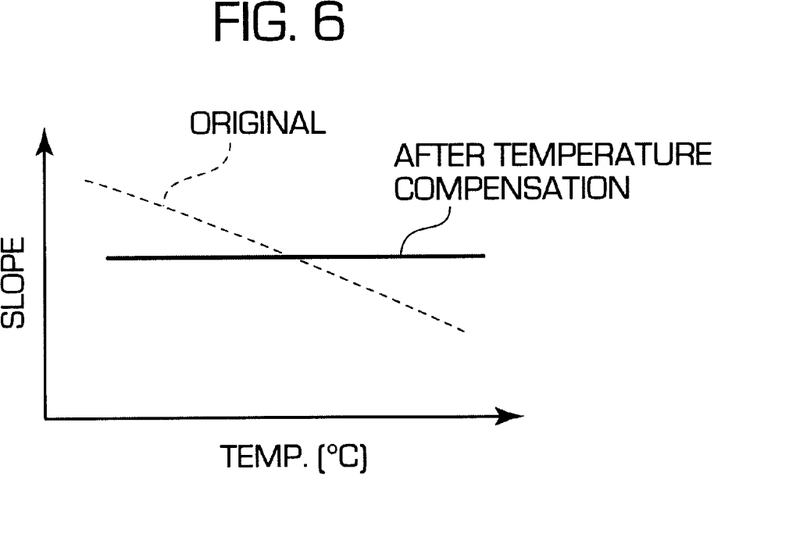
FIG. 6 shows the inclination characteristic of the gain slope with respect to ambient temperature for a case in which the circuit shown in FIG. 3 is used.

FIG. 6 shows the inclination characteristic of the gain slope with respect to ambient temperature when using the circuit shown in FIG. 3.

As shown in FIG. 6, in contrast with the example of the prior art in which the gain slope changed with variations in ambient temperature, the inclination characteristic of the gain slope in this embodiment does not change despite variations in ambient temperature.

Second Embodiment

In the circuit shown in FIG. 3, inductor L1 can be constituted by the bonding wire or conductor pattern that connects the gate terminal of FET Q1 and thermistor Rt.

Figure 7:
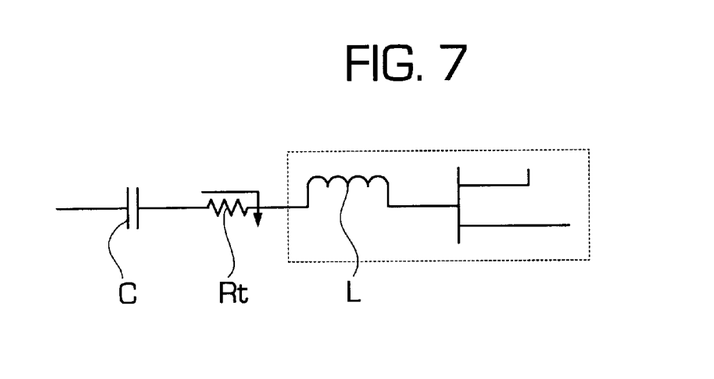
FIG. 7 is a detailed view of the gate input portion of the FET shown in FIG. 3.

FIG. 7 presents a detailed view of the gate input portion of FET Q1 shown in FIG. 3. As shown in FIG. 7, even in cases in which inductor L1 is not connected to the gate terminal of FET Q1, a minute parasitic L component exists between the gate terminal of FET Q1 and thermistor Rt due to the bonding wire that connects the gate terminal of FET Q1 and thermistor Rt, and in addition, resonance is generated by the gate capacitance of FET Q1.

Third Embodiment

Figure 8:
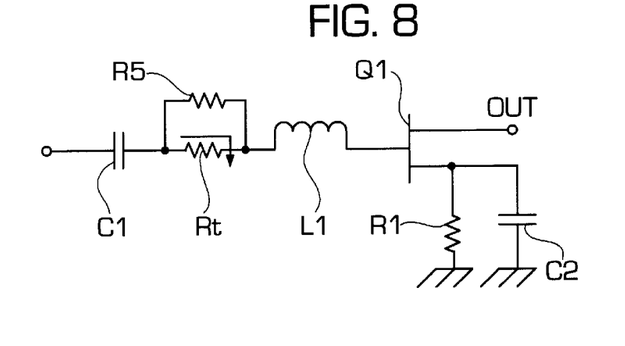
FIG. 8 is a circuit diagram showing the configuration of the semiconductor circuit according to the third embodiment of the present invention.

FIG. 8 is a circuit diagram showing the configuration of the semiconductor circuit according to the third embodiment of the present invention. This circuit is only the alternating-current portion of the semiconductor circuit of this invention.

As shown in FIG. 8, this embodiment is of a configuration in which second resistance R5 in parallel with thermistor Rt is added to the circuit shown in FIG. 3.

Figure 9:
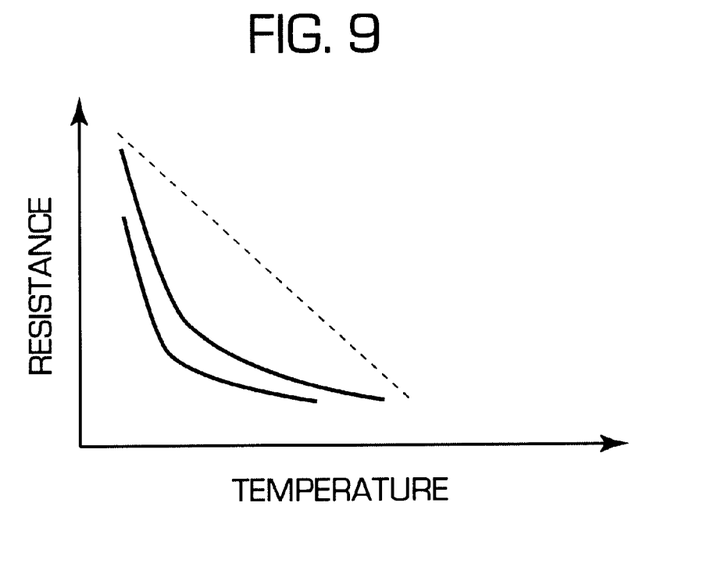
FIG. 9 shows one example of the characteristics of a thermistor having a negative temperature characteristic.

FIG. 9 shows an example of the characteristics of thermistors having a negative temperature characteristic.

As shown by the solid lines in FIG. 9, thermistors on the market do not provide a continuum of characteristics, each having their own predetermined characteristics.

If the characteristic indicated by the broken line is called for, however, the desired characteristic can be obtained by connecting resistance R5 having any resistance in parallel with thermistor Rt as shown in FIG. 8.

Fourth Embodiment

Figure 10:
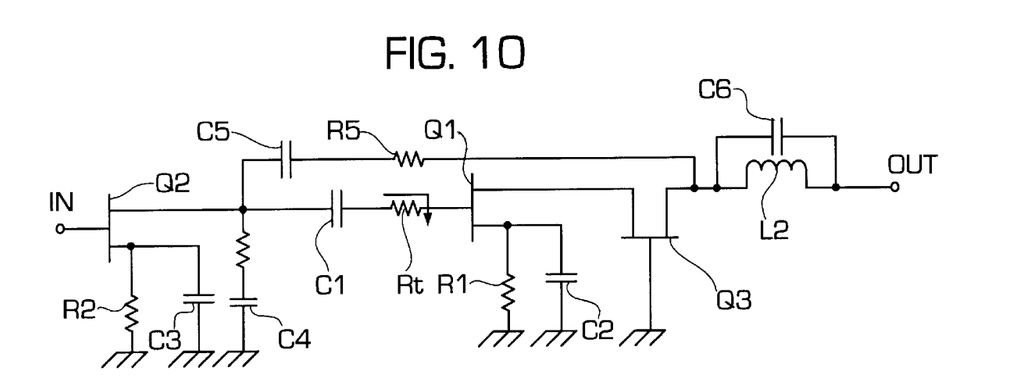
FIG. 10 is a circuit diagram showing the configuration of the semiconductor circuit according to the fourth embodiment of the present invention.

FIG. 10 is a circuit diagram showing the semiconductor circuit according to the fourth embodiment of the present invention. This figure shows the circuit shown in FIG. 3 in more concrete terms. This circuit is only the alternating-current portion of the semiconductor circuit of this invention.

As shown in FIG. 10, this embodiment is provided on the input side of the circuit shown in FIG. 3 with: s second FET Q2 that takes as the input terminal the gate side between input terminal and capacitor C1 and that has its drain terminal connected to capacitor C1, fourth resistor R2 and third capacitor C3 connected in parallel between the source terminal of FET Q2 and ground, and fifth resistance R3 and fourth capacitor C4 connected in series between the drain terminal of FET Q2 and ground; and is provided on the output side of the circuit shown in FIG. 3 with: third FET Q3 having its source terminal connected to the drain terminal of FET Q1, its gate terminal connected to ground; sixth resistance R4 and fifth capacitor C5 connected in series between the drain terminal of FET Q3 and the drain terminal of FET Q2 and provided as a feedback loop; and, functioning as a resonant circuit, sixth capacitor C6 and second inductor L2 connected in parallel between the output terminal and the drain terminal of FET Q3.

In the circuit configured according to the foregoing description, a gain slope with gentle inclination is generated when the ambient temperature rises and a gain slope with steep inclination is generated when the ambient temperature drops in the resonant circuit made up of capacitor C6 and inductor L2. However, as described in the first embodiment, fluctuation of the value of Q in the circuit shown in FIG. 3 with respect to the ambient temperature is canceled by the fluctuation in the gain characteristic with respect to ambient temperature of the gain slop generated in the resonant circuit made up of capacitor C6 and inductor L2, and the inclination characteristic of the gain slope is thus fixed regardless of variations in the ambient temperature.

Fifth Embodiment

Figure 11:
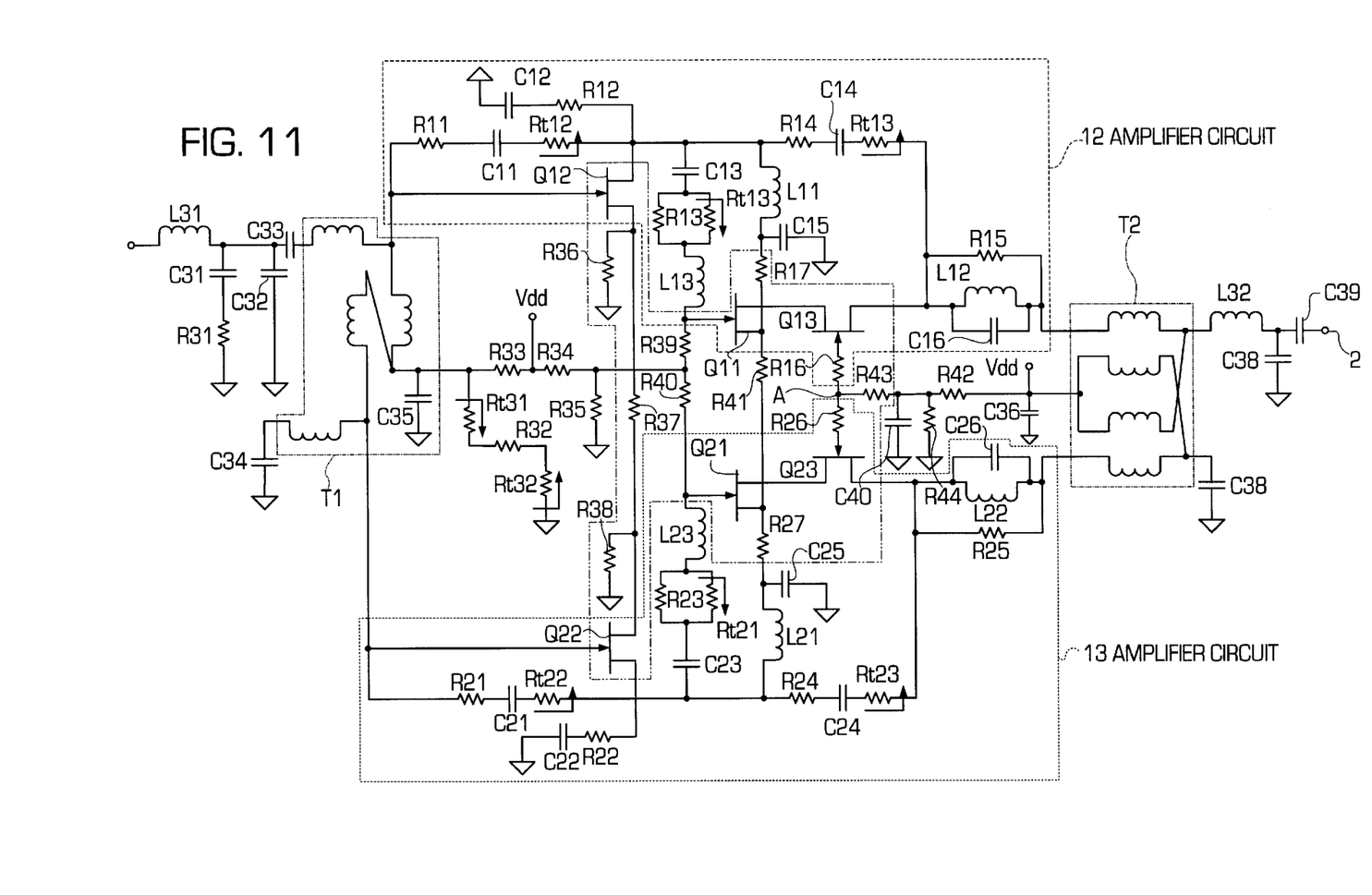
FIG. 11 is a circuit diagram showing the configuration of the semiconductor circuit according to the fifth embodiment of the present invention.

FIG. 11 is a circuit diagram showing the semiconductor circuit according to the fifth embodiment of the present invention.

As shown in FIG. 11, inputted signals in this embodiment are distributed into two different signals, the two distributed signals each being amplified by amplifier circuits 12 and 13, and the signals amplified in amplifier circuits 12 and 13 then being synthesized and outputted.

Transformer T1, which is grounded by way of capacitors C34 and C35, is provided as a distributing means for distributing signals inputted by way of input terminal 1 into two signals of different phase; and transformer T2, which is grounded by way of capacitor C37, is provided as a synthesizing means for synthesizing the two signals amplified by amplifier circuits 12 and 13 as one signal.

Amplifier circuit 12 is made up of: FETs Q11–Q13 connected in multiple stages; thermistor Rt11 and resistor R13 connected in parallel and provided as the gate resistance of FET Q11, which is the second stage; inductor L13 provided between the gate terminal of FET Q11 and the connection point between thermistor Rt11 and resistor R13; resistor R11, capacitor C11, and thermistor Rt12 connected in a series between the drain terminal and gate terminal of FET Q12, the gate terminal being the input of amplifier circuit 12; resistor R12 and capacitor C12 connected in a series between the drain terminal of FET Q12 and a prescribed potential; capacitor C13 connected between the connection point between thermistor Rt11 and resistor R13 and the drain terminal of FET Q12; inductor L11 and resistor R17 connected in a series between the drain terminal of FET Q12 and the source terminal of FET Q11; capacitor C15 connected between the connection point of inductor L11 and resistor R17 and a prescribed potential; resistor R14, capacitor C14 and thermistor Rt13 connected in a series between the drain terminal of FET Q12 and the drain terminal of FET Q13; resistor R16 connected to the gate terminal of FET Q13; and resistor R15, inductor L12 and capacitor C16 connected together in parallel between the drain terminal of FET Q13 and the output terminal of amplifier circuit 12; the drain terminal of FET Q11 and the source terminal of FET Q13 being connected together.

Amplifier circuit 13 is made up of: FETs Q21–Q23 connected in multiple stages; thermistor Rt21 and resistor R23 connected in parallel and provided as the gate resistance of FET Q21, which is the second stage; inductor L23 provided between the gate terminal of FET Q21 and the connection point between thermistor Rt21 and resistor R23; resistor R21, capacitor C21, and thermistor Rt22 connected in a series between the drain terminal and gate terminal of FET Q22, the gate being the input of amplifier circuit 13; resistor R22 and capacitor C22 connected in a series between the drain terminal of FET Q22 and a prescribed potential; capacitor C23 connected between the connection point between thermistor Rt21 and resistor R23 and the drain terminal of FET Q22; inductor L21 and resistor R27 connected in a series between the drain terminal of FET Q22 and the source terminal of FET Q21; capacitor C25 connected between the connection point of inductor L21 and resistor R27 and a prescribed potential; resistor R24, capacitor C24 and thermistor Rt23 connected in a series between the drain terminal of FET Q22 and the drain terminal of FET Q23; resistor R26 connected to the gate terminal of FET Q23; and resistor R25, inductor L22 and capacitor C26 connected together in parallel between the drain terminal of FET Q23 and the output terminal of amplifier circuit 13; the drain terminal of FET Q21 and the source terminal of FET Q23 being connected together.

Further, the gate terminal of FET Q13 and the gate terminal of FET Q23 are connected together by way of resistors R16 and R26.

The input side of transformer T1 is provided with: capacitor C33 and inductor L31 connected in a series between transformer T1 and input terminal 1; capacitor C31 and resistor R31 connected in a series between the connection point of capacitor C33 and inductor L31 and a prescribed potential; and capacitor C32 connected between the connection point between capacitor C33 and inductor L31 and a prescribed potential; and the output side of transformer T2 is provided with: inductor L32 and capacitor C39 connected in a series between transformer T2 and output terminal 2; and capacitor C38 connected between the connection point between inductor L32 and capacitor C39 and a prescribed potential.

Between amplifier circuit 12 and amplifier circuit 13 are provided: resistor R41 between the source terminal of FET Q11 and the source terminal of FET Q21; resistors R39 and R40 connected in a series between the gate terminal of FET Q11 and the gate terminal of FET Q21; resistors R33 and R34 connected in a series between the connection point between resistor R39 and resistor R40 and transformer T1; resistor R32 and thermistors Rt31 and Rt32 connected in a series between the connection point between resistor R33 and transformer T1 and a prescribed potential; resistor R35 connected between a prescribed potential and the connection point between resistor R34 and the connection point between resistors R39 and R40; resistor R37 connected between the source terminal of FET Q12 and the source terminal of FET Q22; resistor R36 connected between the source terminal of FET Q12 and a prescribed potential; resistor R38 connected between the source terminal of FET Q22 and a prescribed potential; resistors R42 and R43 connected between the connection point between resistor R16 and resistor R26 and transistor T2; resistor R44 and capacitor C40 connected in parallel between the connection point between resistor R42 and resistor R43 and a prescribed potential; and capacitor C36 connected between the connection point between resistor R42 and transformer T2 and a prescribed potential; and moreover, power supply voltage Vdd is applied to the connection point between resistor R33 and resistor R34 and to the connection point between resistor R42 and transformer T2.

Thermistors Rt11, Rt21, and Rt31 are thermally sensitive resistance elements in which resistance changes with a negative temperature characteristic according to the ambient temperature, and thermistors Rt12, Rt13, Rt22, Rt23 and Rt32 are thermally sensitive resistance elements in which resistance changes with a positive temperature characteristic according to the ambient temperature.

In a semiconductor circuit configured according to the foregoing description, the circuit shown in FIG. 3 that is made up of capacitor C1, thermistor Rt, inductor L1 and FET Q1 is constituted by capacitor C13, thermistor Rt11, inductor L13 and FET Q11 in amplifier circuit 12, and this circuit functions such that fluctuations in the gain characteristic with respect to ambient temperature of the gain slope of the resonant circuit made up by inductor L12 and capacitor C16 in amplifier circuit 12 are canceled by fluctuations of the value of Q with respect to ambient temperature in the circuit made up of capacitor C13, thermistor Rt11, and inductor L13. As a result, the inclination characteristic of the gain slope outputted from amplifier circuit 12 is fixed despite variations in ambient temperature.

Similarly, in amplifier circuit 13 as well, the circuit shown in FIG. 3 that is made up by capacitor C1, thermistor Rt, inductor L1 and FET Q1 is constituted by capacitor C23, thermistor Rt21, inductor L23, and FET Q21; and this circuit functions such that fluctuations in the gain characteristic with respect to ambient temperature in the gain slope generated by the resonant circuit made up by inductor L22 and capacitor C26 in amplifier circuit 13 are canceled by fluctuations in the value of Q with respect to ambient temperature in the circuit made up by capacitor C23, thermistor Rt21, and inductor L23, whereby the inclination characteristic of the gain slope outputted from amplifier circuit 13 is uniform despite variations in ambient temperature.

In an actual case, if the amplifier circuit configured according to the foregoing description is a CATV amplifier of 50–860 MHz and if thermistors in which resistance changes with a negative temperature coefficient of constant B=800 in accordance with ambient temperature are used for each of thermistors Rt11 and Rt21, the gain inclination can be controlled to changes within 0.8 dB over a temperature range of 30–100° C.

In this embodiment, moreover, inductor L12 and capacitor C16 as well as inductor L22 and capacitor C26 that constitute the resonant circuits that generate the gain slope are each provided outside the feedback loops.

As a result, changes in impedance occur only on the output side and correction of impedance can be easily effected.

In this embodiment, moreover, thermistors Rt31 and Rt32 are connected in a series between the connection point between resistor R33 and transformer T1 and a prescribed potential.

As a result, the current is a minimum value in the vicinity of a prescribed temperature, and the circuit current increases as the ambient temperature falls from a prescribed temperature or as the ambient temperature rises from a prescribed temperature, thereby enabling prevention of deterioration of distortion characteristic due to changes in temperature.

In this embodiment, resistor R43 having a resistance of 10–100Ω is provided between resistor R42 and the connection point between resistor R16 and resistor R26, and capacitor C40 is provided between the connection point between resistor R42 and resistor R43 and a prescribed potential, the circuit constants of these components being set according to termination conditions.

Thus, in a case in which fluctuation in potential occurs at point A in the figure, the fluctuation in potential (waves) is absorbed by resistor R43, and a standing wave is not generated, thereby enabling prevention of deterioration by even distortion (principally CSO) that is caused by the standing wave.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit comprising:
    an FET amplifying circuit that amplifies and outputs an alternating current signal; and
    a thermally sensitive resistance element provided in series with the gate of said FET on an input side of said amplifying circuit, said thermally sensitive resistance element varying resistance according to ambient temperature.

2. A semiconductor circuit comprising:
    a first FET(Field Effect Transistor) wherein a drain side thereof is an output terminal; and
    a first inductor, a first resistor, and a first capacitor connected in a series between an input terminal and the gate terminal of said first FET;
    wherein said first resistor is a thermally sensitive element that varies resistance according to ambient temperature.

3. A semiconductor circuit according to claim 2 wherein said first inductor is formed from a bonding wire or conductor pattern.

4. A semiconductor circuit according to claim 2 comprising a second resistor that is connected parallel to said first resistor.

5. A semiconductor circuit according to claim 3 comprising a second resistor connected in parallel with said first resistor.

6. A semiconductor circuit according to claim 2, comprising:
    a third resistor and a second capacitor connected in parallel between a source terminal of said first FET and ground;
    a second FET provided between said first capacitor and said input terminal and having its drain terminal connected to said first capacitor and its gate terminal connected to said input terminal;
    a fourth resistor and a third capacitor connected in parallel between a source terminal of said second FET and ground;
    a fifth resistor and a fourth capacitor connected in a series between a drain terminal of said second FET and ground;
    a third FET provided between said first FET and said output terminal and having its gate terminal connected to ground; its source terminal connected to the drain terminal of said first FET, and its drain terminal connected to said output terminal;
    a sixth resistor and a fifth capacitor connected in series between a drain terminal of said third FET and the drain terminal of said second FET; and
    a resonant circuit between the drain terminal of said third FET and said output terminal.

7. A semiconductor circuit according to claim 3, comprising:
    a third resistor and a second capacitor connected in parallel between a source terminal of said first FET and ground;
    a second FET provided between said first capacitor and said input terminal and having its drain terminal connected to said first capacitor and its gate terminal connected to said input terminal;
    a fourth resistor and a third capacitor connected in parallel between a source terminal of said second FET and ground;
    a fifth resistor and a fourth capacitor connected in a series between the drain terminal of said second FET and ground;
    a third FET provided between said first FET and said output terminal and having its gate terminal connected to ground; its source terminal connected to the drain terminal of said first FET, and its drain terminal connected to said output terminal;
    a sixth resistor and a fifth capacitor connected in series between the drain terminal of said third FET and the drain terminal of said second FET; and
    a resonant circuit between the drain terminal of said third FET and said output terminal.

8. A semiconductor circuit according to claim 4, comprising:
    a third resistor and a second capacitor connected in parallel between a source terminal of said first FET and ground;
    a second FET provided between said first capacitor and said input terminal and having its drain terminal connected to said first capacitor and its gate terminal connected to said input terminal;
    a fourth resistor and a third capacitor connected in parallel between a source terminal of said second FET and ground;
    a fifth resistor and a fourth capacitor connected in a series between the drain terminal of said second FET and ground;
    a third FET provided between said first FET and said output terminal and having its gate terminal connected to ground; its source terminal connected to the drain terminal of said first FET, and its drain terminal connected to said output terminal;
    a sixth resistor and a fifth capacitor connected in a series between the drain terminal of said third FET and the drain terminal of said second FET; and
    a resonant circuit between the drain terminal of said third FET and said output terminal.

9. A semiconductor circuit according to claim 5, comprising:
    a third resistor and a second capacitor connected in parallel between a source terminal of said first FET and ground;
    a second FET provided between said first capacitor and said input terminal and having its drain terminal connected to said first capacitor and its gate terminal connected to said input terminal;
    a fourth resistor and a third capacitor connected in parallel between a source terminal of said second FET and ground;
    a fifth resistor and a fourth capacitor connected in a series between the drain terminal of said second FET and ground;
    a third FET provided between said first FET and said output terminal and having its gate terminal connected to ground; its source terminal connected to the drain terminal of said first FET, and its drain terminal connected to said output terminal;
    a sixth resistor and a fifth capacitor connected in series between the drain terminal of said third FET and the drain terminal of said second FET; and a resonant circuit between the drain terminal of said third FET and said output terminal.

10. A semiconductor circuit according to claim 6, wherein said resonant circuit is constituted by second inductor and a sixth capacitor in a parallel connection.

11. A semiconductor circuit according to claim 7, wherein said resonant circuit is constituted by second inductor and a sixth capacitor in a parallel connection.

12. A semiconductor circuit according to claim 8, wherein said resonant circuit is constituted by second inductor and a sixth capacitor in a parallel connection.

13. A semiconductor circuit according to claim 9, wherein said resonant circuit is constituted by second inductor and a sixth capacitor in a parallel connection.

14. A semiconductor circuit according to claim 1 wherein said thermally sensitive resistance element has a negative temperature characteristic.

15. A semiconductor circuit according to claim 2 wherein said thermally sensitive resistance element has a negative temperature characteristic.

16. A semiconductor circuit according to claim 3 wherein said thermally sensitive resistance element has a negative temperature characteristic.

17. A semiconductor circuit according to claim 4 wherein said thermally sensitive resistance element has a negative temperature characteristic.

18. A semiconductor circuit according to claim 5 wherein said thermally sensitive resistance element has a negative temperature characteristic.

19. A semiconductor circuit according to claim 6 wherein said thermally sensitive resistance element has a negative temperature characteristic.

20. A semiconductor circuit according to claim 7 wherein said thermally sensitive resistance element has a negative temperature characteristic.

21. A semniconductor circuit according to claim 8 wherein said thermally sensitive resistance element has a negative temperature characteristic.

22. A semiconductor circuit according to claim 9 wherein said thermally sensitive resistance element has a negative temperature characteristic.

23. A semiconductor circuit according to claim 10 wherein said thermally sensitive resistance element has a negative temperature characteristic.

24. A semiconductor circuit according to claim 11 wherein said thermally sensitive resistance element has a negative temperature characteristic.

25. A semiconductor circuit according to claim 12 wherein said thermally sensitive resistance element has a negative temperature characteristic.

26. A semiconductor circuit according to claim 13 wherein said thermally sensitive resistance element has a negative temperature characteristic.

* * * * *